(12) United States Patent
Haukness et al.

(10) Patent No.: US 8,484,407 B2
(45) Date of Patent: Jul. 9, 2013

(54) FLASH MEMORY TIMING PRE-CHARACTERIZATION

(75) Inventors: Brent Haukness, Monte Sereno, CA (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 393 days.

(21) Appl. No.: 12/809,039

(22) PCT Filed: Dec. 23, 2008

(86) PCT No.: PCT/US2008/088223
§ 371 (c)(1),
(2), (4) Date: Jun. 17, 2010

(87) PCT Pub. No.: WO2009/086417
PCT Pub. Date: Jul. 9, 2009

(65) Prior Publication Data
US 2011/0191526 A1    Aug. 4, 2011

Related U.S. Application Data

(60) Provisional application No. 61/008,724, filed on Dec. 21, 2007.

(51) Int. Cl.
*G06F 12/00* (2006.01)
(52) U.S. Cl.
USPC .......................................... 711/103; 711/167
(58) Field of Classification Search
USPC ................................................. 711/103, 167
See application file for complete search history.

(56) References Cited

U.S. PATENT DOCUMENTS

| | | | |
|---|---|---|---|
| 5,793,674 A | 8/1998 | Kubo et al. | |
| 6,205,055 B1 | 3/2001 | Parker | |
| 6,246,611 B1 | 6/2001 | Pawletko et al. | |
| 6,266,749 B1 | 7/2001 | Hashimoto et al. | |
| 6,515,909 B1 | 2/2003 | Wooldridge | 365/185.22 |
| 6,519,716 B1 | 2/2003 | Branstad | |

(Continued)

FOREIGN PATENT DOCUMENTS

WO    2009086417    9/2009

OTHER PUBLICATIONS

EP Request dated Aug. 23, 2010 for Restoration of Right of Priority by Designated Office for EP Application No. 08866212.7. 5 Pages.

(Continued)

*Primary Examiner* — Jared Rutz
(74) *Attorney, Agent, or Firm* — Marc P. Schuyler (57) ABSTRACT

This disclosure provides a method of accurately determining expected transaction times associated with flash memory subdivisions, such as devices, blocks or pages. By performing a test transaction to program each bit of each such unit, the maximum expected programming time of each unit may be determined in advance and used for scheduling purposes. For example, in a straightforward implementation, a relatively accurate, empirically measured time limit may be identified and used to efficiently manage and schedule flash memory transactions without awaiting ultimate resolution of attempts to write to a non-responsive page. This disclosure also provides other uses of empirically-measured maximum flash memory transaction times, including via multiple memory modes and prioritized memory; for example, if a high performance mode is desired, low variation in flash memory transaction times may be tolerated, and units not satisfying these principles may be marked relatively quickly. A mechanism is also provided for recalibrating memory previously marked. By minimizing variability, flash memory can be applied to a broader range of designs and potentially to a broader set of main memory applications.

40 Claims, 7 Drawing Sheets

U.S. PATENT DOCUMENTS

| | | | |
|---|---|---|---|
| 6,940,773 | B2 | 9/2005 | Poechmueller |
| 7,095,669 | B2 | 8/2006 | Oh |
| 2003/0107920 | A1 | 6/2003 | Roohparvar ............. 365/185.22 |
| 2004/0165467 | A1 | 1/2004 | Nguyen et al. ............. 365/225.7 |
| 2004/0100840 | A1 | 5/2004 | Chang et al. .................. 365/201 |
| 2006/0104115 | A1 | 5/2006 | Chun et al. ............... 365/185.17 |
| 2007/0133249 | A1 | 6/2007 | Roohparvar .................. 365/100 |
| 2007/0234183 | A1 | 10/2007 | Hwang et al. .................. 714/763 |
| 2007/0266276 | A1 | 11/2007 | Gatzemeier et al. .......... 714/718 |

OTHER PUBLICATIONS

EP Office Action dated Feb. 14, 2011 re EP Application No. 08866212.7. 6 Pages.

EP Response dated Jul. 7, 2011 to the Official Communication dated Feb. 14, 2011 re EP Application No. 08866212.7-1233. 10 Pages.

KR Notice of Grounds for Rejection dated Oct. 27, 2011 re KR Application No. 2010-7015353. 8 Pages.

Written Opinion of the International Preliminary Examining Authority dated Mar. 19, 2012 re Int'l Application No. PCT/US08/88223. 21 pages.

International Preliminary Report on Patentability (Chapter II) dated Jul. 2, 2012 in International Application No. PCT/US08/088223, Includes a Response to Correct Defects in the International Application. 17 pages.

KR Argument and Amendment dated Jan. 27, 2012 re KR Application No. 10-2010-7015353. 42 pages.

KR Decision for Grant, Dated Jul. 30, 2012. 3 pages.

FLASH MEMORY TIMING PRE-CHARACTERIZATION

This disclosure relates to timing optimization in flash memory. More particularly, this disclosure provides a method of pre-characterizing flash memory transactions.

BACKGROUND

Modern forms of main memory are conventionally based on dynamic random access ("DRAM") technology. While DRAM offers many advantages over other types of memory, its cost, form factor, power requirements and thermal characteristics can be unacceptable for certain classes of devices, among them certain portable or low cost devices. Examples of devices where cost, form factor, power requirements and thermal characteristics can be at-issue include cell phones, personal data assistants (PDAs) and many other forms of portable or special purpose systems. It is desired to have memory design alternatives that are less expensive, more portable or that facilitate longer battery lifespan.

Flash memory is one form of memory that meets these criteria; flash memory, however, presents several limitations that have conventionally restricted its use. One such limitation is that flash memory is usually erased or programmed in units of "blocks" or "pages," each consisting of multiple memory cells. Due to variations in the erase and program times of individual memory cells, such devices often suffer from variable erase and program delays that vary from memory-location-to-memory-location. The requirement of mass-programming or erasing of units of memory renders it difficult to predict programming or erasing completion times, which conventionally inhibits use of flash memory in some applications. For example, in main memory applications where data and instruction turnover can be high, the time delays associated with memory transactions can present difficult scheduling issues. These limitations among others have inhibited widespread use of flash memory in some applications.

What is needed is a way of addressing variable delays associated with flash memory and associated scheduling issues. Ideally, if memory transaction times could be managed in a manner that is predictable, flash memory could be applied to a much broader range of applications; one could thereby conceivably improve power characteristics and improve the pricing of many classes of digital devices. To provide one example, if one could better manage the variability of these delays, one could potentially facilitate widespread application of flash memory to main memory applications, and thereby facilitate lower cost, smaller and more portable general purpose computing platforms.

BRIEF DESCRIPTION OF THE DRAWINGS

FIG. 2 provides a block diagram of a flash memory system. More particularly.

FIG. 6 is a block diagram of a method for measuring maximum memory transaction times for individual units of memory. In FIG. 6, a register setting in a reserved memory area 605) may be used to store any measured values or any device 603.

FIG. 8 depicts a system where a time limit can be defined and stored for each memory unit, such as each block or page of memory.

DETAILED DESCRIPTION

This description of one or more particular embodiments, set out below to enable one to build and use various implementations of the principles discussed herein, is not intended to limit the enumerated claims, but to exemplify their application to certain methods and devices. The description set out below exemplifies application to a flash device that may be calibrated, with measured transaction times stored for use in managing memory transactions. This device may then be managed in a number of ways, including more efficiently marking memory units (such as blocks or pages of memory) as "bad," or for configuring memory for multiple modes of use that may be selected by a controller or software, or for prioritizing flash memory usage. The principles discussed herein, however, may also be applied to other methods and devices as well.

I. INTRODUCTION TO THE PRINCIPAL PARTS

The principles discussed herein may be embodied in a method of empirically measuring expected maximum time associated with a flash memory transaction, such as an erasing transaction, a programming transaction or a read transaction. Each specific flash memory device (or a group of flash memory devices) is pre-characterized by performing a predetermined memory transaction and empirically measuring the time needed for successful completion. This testing is performed, e.g., at time of manufacture, each time a machine powers-up, at a predetermined calibration interval, by simply observing memory transactions as they occur and updating calibration parameters, or by combinations of these. Calibration may be performed at any subdivision or "unit" of memory, including device or chip, block, page, or some other level.

Pre-characterization may be performed to measure an expected maximum transaction time (e.g., programming or erasing), with the aim of obtaining greater granularity in memory management than can be obtained using conventional schemes.

In order to perform these functions, the predetermined transaction may be chosen to be a transaction expected to take the longest amount of time of any similar transaction. For example, if it is desired to measure a maximum erasing time for memory under consideration, a transaction can be selected to toggle all bits of memory under consideration to erase that memory (e.g., for a chip, block, page, or other unit of memory subdivision); similarly, if it is desired to determine a maximum programming time, particularly for NAND-based flash memory, one suitable calibration transaction toggles all bits of memory under consideration to program those bits (e.g., from an erased state). These are not the only transactions that may be selected, e.g., it is possible to use patterns or combinations of patters in writing and erasing data to select a maximum. For example, one may conceivably program a 0-1 pattern, and then invert that pattern and program a 1-0 pattern and take the maximum. Many other possibilities will also occur to one having skill in the art. Transaction time varies with each memory cell that can be programmed or erased, and so, by effectively measuring the maximum time needed to change all bits, and thus all features of all memory cells, it is possible to obtain a measure of the maximum time a memory transaction may be expected to take, necessarily including the programming or erasing of the slowest member cell affected by the transaction. This maximum time is expected to be smaller and more accurate than a generic time-out or maximum program-validate cycle count that might otherwise be applied on an "across-the-board" basis to flash memory. Time can be measured in terms of clock cycles, program-validate cycles, or using some other suitable measure, and can also be measured in terms of maximum applied voltage in a system where control voltage is regularly stepped to avoid over-programming.

Because the pre-characterization (or calibration) is based on measured data, "slow" units of memory, that is, blocks or pages of memory that would conventionally be marked as "bad," can nevertheless still potentially be used. By calibrating memory (and specifically if multiple time limits are used), the embodiments disclosed herein can enable multiple modes of transaction, where "slow" units can perhaps still be used in modes where time-performance is not critical (such as might be determined by operating system or application-specific requirements).

The issue of time variation in programming or erasing of flash memory, and the reason large time-out times are used by memory controllers, are artifacts of the design of flash memory and of the steps typically used to program and erase flash memory. In this regard, it was mentioned above that flash memory is generally programmed or erased in chunks; NOR-based flash memory is typically erased in "blocks" and programmed in multiple byte increments, while NAND-based flash memory is typically both erased in blocks and programmed in "pages," with each page being a further subdivision of a block. These transactions are usually performed by applying a control voltage to cause electrons to tunnel between an electrode and a floating gate. To avoid a condition known as over-programming, cells are typically processed in repeated program-validate cycles (i.e., multiple iterations); at first, a relatively small voltage is applied to the control gate, and the correct erasure or programming is verified for each cell; for cells where success is not verified, the control voltage is then increased, and the process is repeated for those cells which did not erase or program correctly during any previous cycle until all required bits are programmed. If a maximum voltage is reached and some cells are not correctly programmed, the unit of memory (e.g., block or page) is sometimes marked as "bad" and bypassed. The number of iterations required (i.e., program-validate cycles) and programming time required varies from memory-cell-to-memory-cell, and thus, from page-to-page, block-to-block, and device-to-device; this variation occurs because the tolerances and transaction of each cell are different within any given device, and because design varies according to model and manufacturer.

In operation, the time variation of transactions is usually addressed by causing a memory device to change the value of a "read/busy" pin or a register value when the transaction is complete, either because it has completed or a maximum number of transaction cycles have occurred; the memory device may often also set another specific register bit to indicate verification of success of the memory transaction. These values are monitored by a memory controller, which then may then upon detecting a problem responsively mark the memory unit under consideration as "bad." [Marking a unit as "bad" does not necessarily indicate that the unit is dysfunctional, but simply that the controller should skip that unit or specially process it.] Devices and specific memory subdivisions may individually be faster than one another, with the result that flash memory may be capable if managed appropriately of much more efficient operation.

With calibrated statistics known and stored for memory, however, a controller may obtain a much more accurate estimate of time by which a successful erasing transaction or programming transaction (or another memory transaction, such as a read transaction) should be completed, thereby enabling more efficient scheduling and use of flash memory.

Figure 1:
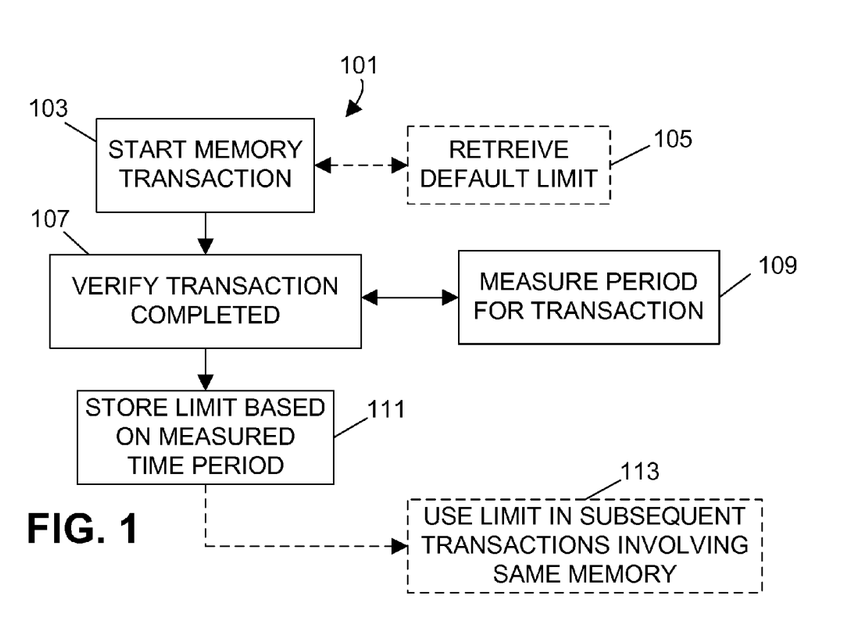
FIG. 1 provides a block diagram that shows measuring time in association with a memory transaction. As indicated by a first dashed line block, this method may optionally be employed to update an existing default limit (such as a processor time-out) and, as indicated by a second dashed line block, the method may also be employed to manage subsequent transactions involving the same memory.

As seen in FIG. 1, one embodiment provides a method of calibrating a flash memory device. The method 101 is performed on at least each individual memory device, such as a memory chip, and may be performed at times of device manufacture, system power-up, a predetermined calibration interval, or ad-hoc during the performance of a run-time memory transaction, such as an erasing transaction or a programming transaction. Ideally, the memory transaction used for calibration is a specific, predetermined transaction, such as an erasing transaction or programming transaction that changes the value of each bit associated with memory under consideration (whether in single or multi-level cell form). As indicated above, changing all bits associated with memory under consideration will presumably involve the maximum amount of time and the maximum number of program-validate cycles associated with any similar transaction (e.g., any other programming transaction for the page or block where all or less than all of the memory cells are affected). The transaction is initiated, as indicated by block 103 in FIG. 1, and a timer measures the time period necessary for successful, verified performance of the transaction (e.g., all bits correctly changed as a result of the transaction), as indicated by function blocks 105, 107 and 109 in FIG. 1. Once testing is complete, the method 101 stores a time limit based upon the measured time period, and it utilizes this time limit in subsequent transactions involving the same memory, as indicated by reference numerals 111 and 113. As used herein, "time limit" can refer to any mechanism for measuring or bounding the operation of a memory transaction, such as a programming transaction, an erasing transaction or other memory transaction (such as a read transaction).

If desired, as indicated by optional block 105 of FIG. 1, a flash memory device may be preprogrammed with a default time limit, for example, in a read-only or other space reserved for control operations; such a value, for example, may be supplied by a device manufacturer. If such a value is provided with the device, the method 101 can either operate upon and replace that value as appropriate, or it may copy the value into other memory (e.g., volatile memory) and operate just upon the copy, retaining the original value for future use (e.g., for next power-up). In one embodiment, separate time limits are provided for each type of memory transaction, e.g., a time limit for a programming transaction, a time limit for an erasing transaction, and a time limit for a read or other transaction, with each limit being updated and adjusted according to the principles discussed herein. In several of the embodiments discussed below, for ease of understanding, it should be assumed that only one such limit is being operated upon, either a programming operation or an erasing operation, but the principles discussed herein are not so limited.

Figure 2:
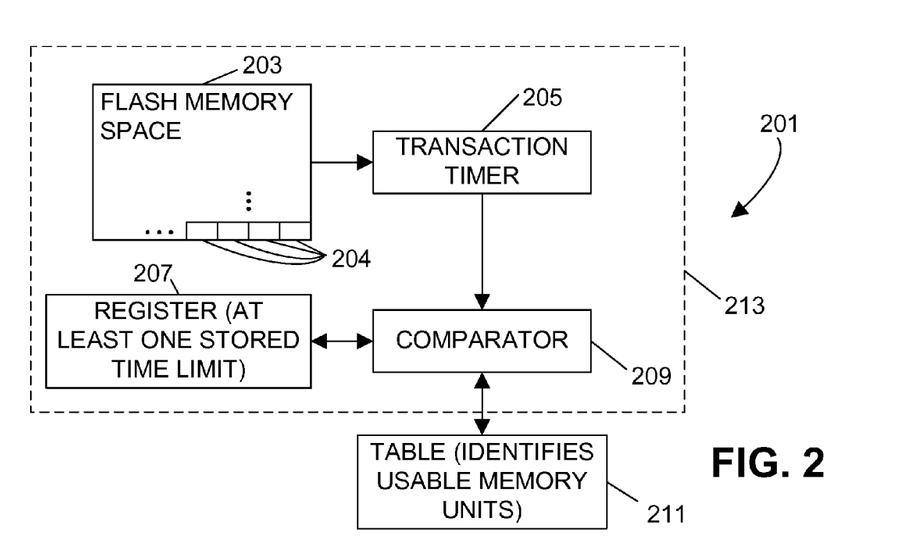
FIG. 2 shows a system where a buffer or register stores at least one limit corresponding to flash memory timing. The limit may be applied to generate a table that shows which units of memory (device, block, page, etc.) are usable in one or more modes of memory usage.

FIG. 2 illustrates a system 201 that measures transaction time in flash memory. More particularly, a flash memory space 203 may include a number of units of subdivision, for example, blocks or pages or other units, represented by reference numeral 204. A transaction timer 205 is operatively coupled with the space in order to time at least one type of transaction involving the memory space. The value computed by this timer may be compared with a value held by a buffer or register 207 for the associated memory space, using a comparator 209. In one embodiment, the register may hold a dedicated value for each memory unit 204, with these transactions being performed on each individual memory unit.

FIG. 2 also shows a table 211 that identifies usable memory units; in this regard, should the timing of any transaction exceed a predetermined time limit, any associated memory subdivision unit 204 may be marked for limited use and thus not effectively identified in the table as usable memory. FIG. 2 shows a dotted line block 213, which represents that many of the elements of FIG. 2 may be integrated inside a single device or chip; that is to say, in FIG. 2, a memory chip may include simply the flash memory space 203, with other elements being implemented elsewhere, such as in a controller and off-chip memory, or some or all of the elements may optionally be housed in a single chip, as indicated by numeral 213. In such an embodiment, a memory controller (not seen in FIG. 2) may interact with block 213 to retrieve any time values stored in the chip and copy them to the controller's memory, to define an off-chip table that identifies useable memory units. Other layouts of the elements seen in FIG. 2 are also possible, including performance of many of these functions by a computer operating system.

Figure 3:
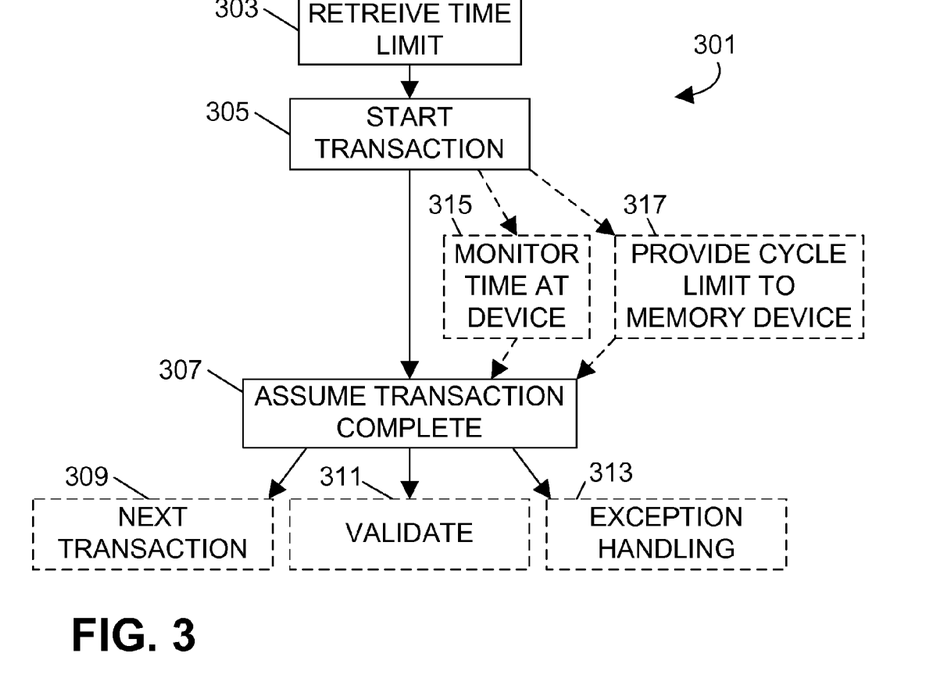
FIG. 3 is a diagram of methods of managing memory using measured time. In particular, dashed line blocks in FIG. 3 are used to introduce embodiments where a controller may (1) simply assume successful completion of a prior transaction within an associated time limit, (2) perform a validation function at transaction's end to verify success based on a time limit, or (3) proceed to a next transaction and rely on exception processing (e.g., interrupt processing) to identify problems with prior transactions, as indicated respectively by dashed line blocks 309, 311 and 313 in FIG. 3.

FIG. 3 is a diagram used to introduce methods of managing memory using measured time. In particular, FIG. 3 illustrates a method 301 in which a controller may retrieve a time limit and commence a memory transaction, as indicated by reference numerals 303 and 305. In the specific embodiments associated with FIG. 3, the controller from its perspective utilizes measured time to enhance its scheduling of memory transactions, and it accordingly expects a memory device affected by the transaction to complete the transaction within the time limit, per reference numeral 307. This function may be realized manifested in a number of ways; for example, dashed line blocks 309, 311 and 313 are used in FIG. 3 are used to introduce embodiments where a controller may (1) simply assume successful completion of a prior transaction within an associated time limit, (2) perform a validation function at transaction's end to verify success based on a time limit, or (3) proceed to a next transaction and rely on exception processing (e.g., interrupt processing) to identify problems with prior transactions. As also indicated by optional (dashed line) function blocks 315 and 317, memory transactions may also be monitored through active management of transaction time at the device, or by specifying via a memory instruction a specific time limit that is to be applied by a memory device; in such an embodiment, the controller may rely upon a memory device to handle the transaction within the associated time limit, and the controller may actively confirm successful processing or may rely on the memory device to report problems through an exception processing procedure, e.g., via handling per block 313.

Figure 4:
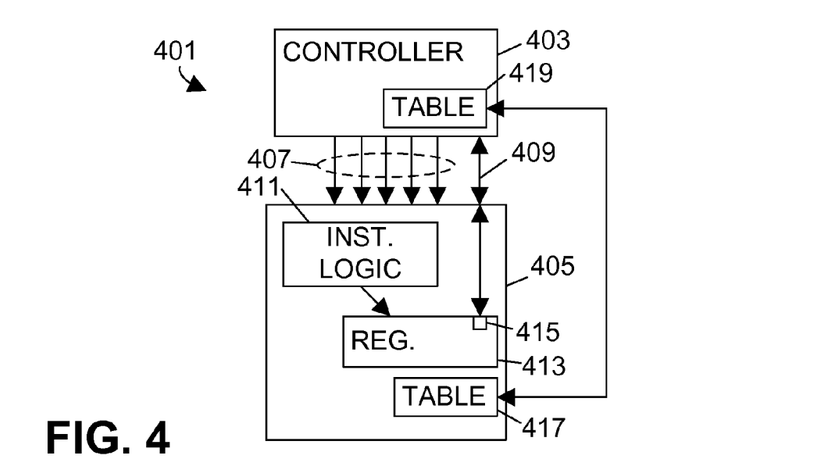
FIG. 4 is a block diagram of a memory system 401 which is adapted to provide a time limit to a memory device 405 as part of an instruction.

FIG. 4 is a block diagram of a memory system 401 which is adapted to permit a controller 401 to provide a pre-determined transaction time limit to a memory device 405 as part of an instruction. Only one memory device 405 is depicted in FIG. 4, but it should be understood that a number of memory devices may be managed by the controller. In particular, FIG. 4 illustrates a number of signal lines 407, each of which conceptually represents a different memory instruction, or perhaps better stated, a particular memory transaction communicated through multiple alternate instructions, each having a different associated time limit; for example, the controller of FIG. 4 may specify a number of program-validate cycles to the memory device as part of the memory instruction. To process these differing instructions, the memory device 405 may have on-board instruction logic that causes the memory device to limit its operations to the corresponding number of program-validate cycles. As described above, the memory device may report successful completion by changing an output of a "ready/busy" pin, or may change a register 413, to specifically store a value 415 that may be monitored by the controller or exception handling circuitry. FIG. 4 also illustrates a table 417 that may be used by the device to store time limits. For example, as mentioned in connection with the discussion of other embodiments, the time limits may be stored in a non-volatile manner on board the memory device 405 and retrieved for active management by the controller 403 or operating system. Other operations are also possible, e.g., the time limits once computed may be stored in any number of memory locations, and may be used by memory device, controller, operating system (or application) depending on implementation.

Figure 5:
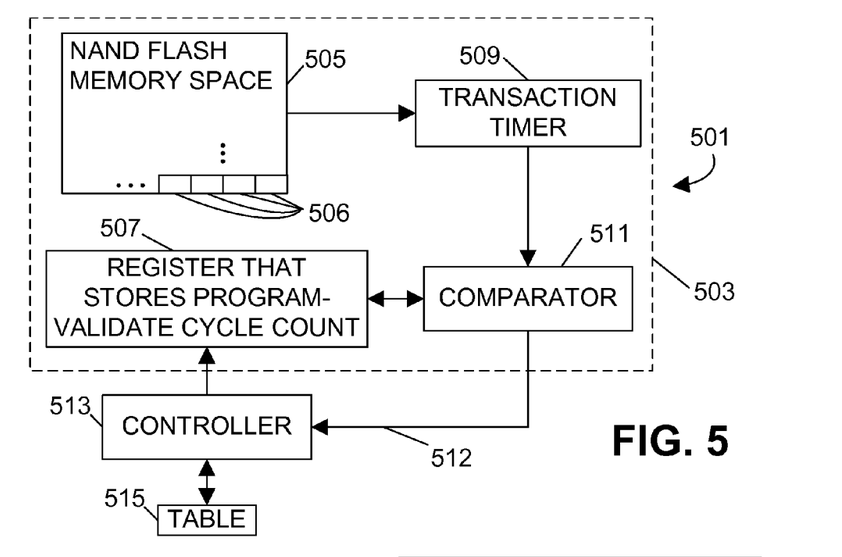
FIG. 5 is a diagram of a flash memory device that includes an on-board register setting that stores a program-validate cycle count. The comparator is used to evaluate whether memory may be marked as "bad" given any specific memory mode represented by the register setting.

FIG. 5 illustrates a system 501 where a flash memory device (e.g., a flash memory chip) 503 can monitor memory transactions during run-time to implement an onboard time-out function using measured parameters. Although only one flash memory device is seen in FIG. 5, it should be noted that in practice, such a system will include a number of similar devices (identical to device 503) and a flash memory controller 513 that manages and controls memory transactions for these devices. Notably, the embodiment of FIG. 5 is seen to monitor time in units of program-verify cycles for a NAND-based flash memory. Each device 503 may include a flash memory space 505, a register 507 that stores a time limit, a transaction timer 509, and a comparator 511. The flash memory space can be organized into memory pages 506 that are used to store instructions or data under the supervision of a flash memory controller 513. Page size is a design choice, but conventionally is used to organize memory into units on the order of 4 k bytes, such that a one gigabyte memory device would typically have on the order of several hundred thousand pages. For each transaction requested by the controller (or for a specific type of transaction, e.g., programming of a page of NAND flash memory), the transaction timer 509 monitors the number of program-verify cycles required for the page under consideration, and provides its output to the comparator 511. If the comparator determines that the program-verify cycles exceed an empirically determined time limit, provided by a setting from register 507, the comparator asserts an error condition 512, which notifies the controller 513. The controller in response to this signal can also mark the particular page as "bad" by writing an appropriate value into a memory usage table 515, or it flags it for special processing (discussed further below).

Figure 6:
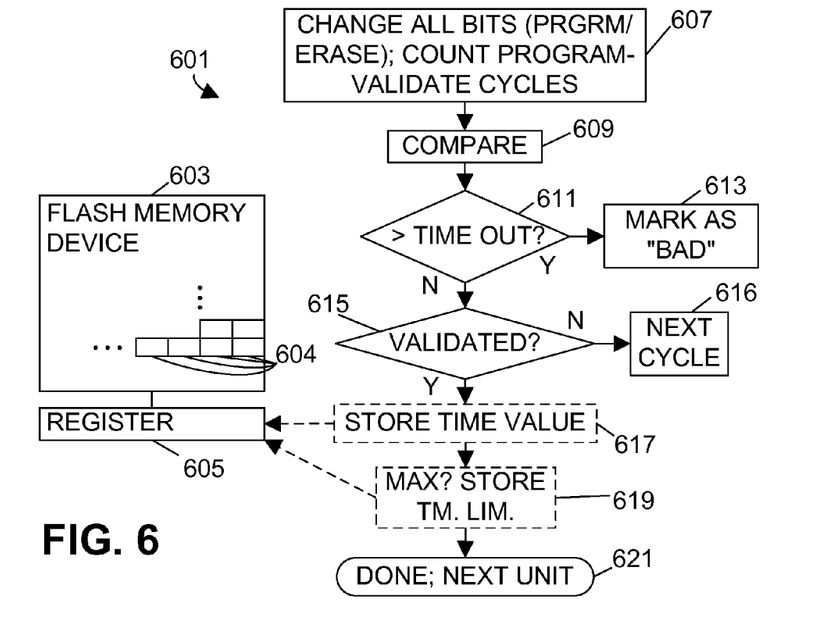

Computation of the time limit stored in the register 507 is explained with reference to FIG. 6. In particular, FIG. 6 illustrates a method 601 of testing flash memory and computing a time limit for later use. A flash memory device 603, seen at the left-side of FIG. 6, includes a number of memory units 604, and it may also include a register 605 which is used to store the calculated time limit. For each memory unit, 604, a memory controller initiates a predetermined memory transaction (or a series of transactions) that toggles each bit of the associated unit. For example, the controller can first erase memory and then initiate a transaction that programs every bit of every cell of the associated memory unit. Each time a transaction is initiated, the transaction timer (not seen in FIG. 6) stores the number of program-validate cycles and monitors for successful completion as indicated by reference numerals 607, 609 and 611. This pattern continues up to a predetermined maximum (for example, a generic time-out value specified by the manufacturer) and if the transaction cannot be performed within this maximum, the particular memory unit can be marked as "bad" and the system can proceed to the next unit, as indicated by function block 613 in FIG. 6; if certain elements of memory have not been correctly programmed, the control voltage to the pertinent cells may be increased and the programming transaction again attempted, as indicated by function blocks 615 and 616. If the transaction is successful, however, within the indicated maximum, the system stores the new value in association with the memory unit, as indicated in FIG. 6 by function block 617, and determines whether (in the embodiment of FIG. 6) the new value should be used as a limit for the memory unit. For example, in an embodiment where a single time limit is computed for the memory device, the system can determine whether the measured time represents a maximum time amongst units not marked as "bad;" if the system has processed all memory units, then this value can be stored as a new register setting, as indicated by block 619. If other memory units remain to be calibrated, the system then proceeds to the next unit, as indicated by reference numeral 621. Other, more sophisticated time limit computation algorithms are possible based on system constraints, and may optionally be performed after all memory units have been pre-characterized. For example, a flash memory system may be programmed to use an algorithm that permits selection of a time limit within a range up to a predetermined maximum. Alternatively, the system could be programmed to employ a statistical approach (select a time limit to be a standard deviation greater than the average of empirically measured times for the device). As indicated by dashed line functions 617 and 619, time values may optionally be stored by the memory controller instead of in the register proximate to or within the memory device.

Figure 7:
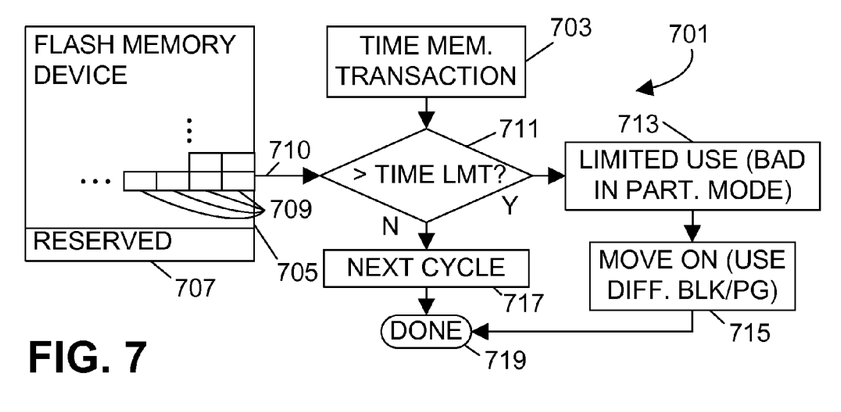
FIG. 7 is a block diagram that shows how a measured time limit may be used during run-time to more efficiently validate success of memory transactions and mark units if a transaction cannot be validated as successful within the time limit.

FIG. 7 illustrates one method of application of a single time limit at run-time. In particular, a method 701 computes an empirically measured time limit used for memory transactions, where the time limit is more accurate than generic timing information supplied by a memory manufacturer or a systems integrator. During run-time, each new memory transaction (e.g., program of a NAND page, or erase of a block) is timed, as indicated by function block 703. In this system, each flash memory device 705 includes a reserved area 707 that stores any time values needed for run-time transaction performed on blocks or pages 709. An appropriate time limit, for example, a previously determined time limit, can be provided to a compare function for comparison with time of a transaction that is under scrutiny, as indicated by numerals 710 and 711. If the transaction timer exceeds the time limit, then the page or block under scrutiny can be marked as "bad" for the particular mode, and the controller (not seen in FIG. 7) can if appropriate try a new block, as indicated by blocks 713, 715 and 719. Alternatively, if the time limit has not been exceeded and the transaction has not yet been successful, the next program-validate cycle can be initiated, as indicated by block 717. As used herein, "limited use" means that the memory is not used for at least some memory transactions, either because the memory or memory unit is marked as "bad" (i.e., for all purposes, or for a given mode of operation) or because the memory is excluded from use in one memory mode (but may be usable in another mode, for example, a non-performance mode or in low priority memory transactions).

Figure 8:
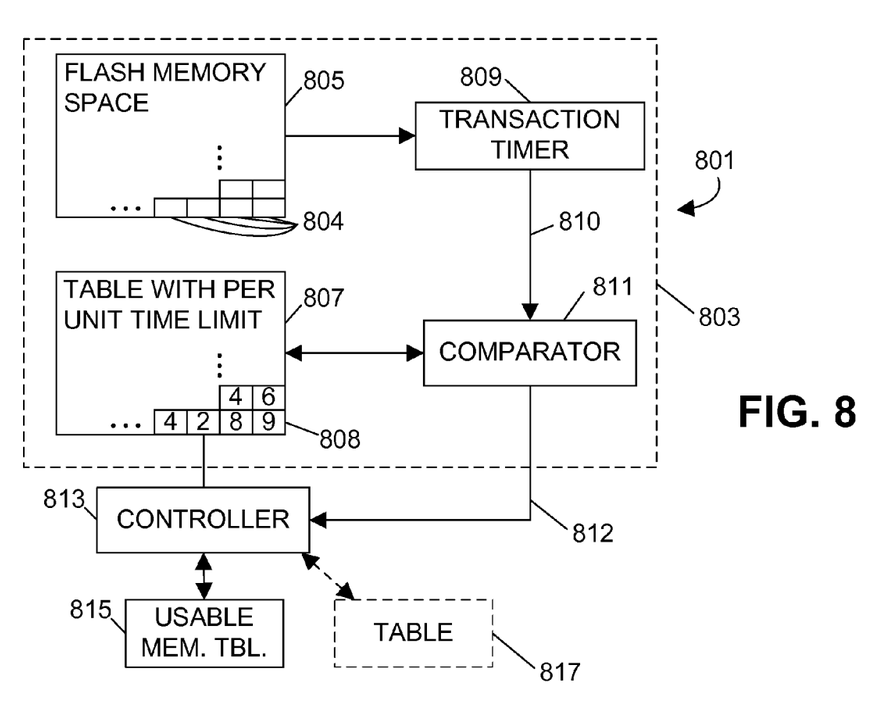
In FIG. 8, a table 807 can be used to store times (e.g., clock cycles, program-validate cycles or other units of measure) that each correspond to maximum transaction limits for a memory unit 804. As indicated by dashed line block 817, this table may optionally be maintained by a memory controller 813 (e.g., in on-board controller memory). In one embodiment, it may also be retained in non-volatile manner in each memory device, and the copied into the controller or monitored by the operating system in actual use.

In another embodiment, depicted by FIG. 8, a specific time limit may also be selected for each individual memory unit 804, for even greater granularity in performance. FIG. 8 illustrates a system 801 that is similar to the one depicted in FIG. 5, but which features a buffer or register 807 that stores a number of time limits 808. Each time limit corresponds to a unit 804 in memory 803, and may be expressed in a number of program-validate cycles or some other time measure. Similar to the structure described in connection with FIG. 5, above, a transaction timer or equivalent mechanism 809 can be used to effectively monitor completion of each memory transaction involving a given memory unit 804 within an associated time. An output 810 of the timer can then be provided to a comparator 811, which signals or otherwise notifies a controller 813 that a run-time transaction for the memory unit did not successfully complete within the pertinent time limit; for example, the comparator may raise an error signal 812, which causes a flash memory controller 813 to mark the particular unit in its memory usage table 815. Dashed line block 803 in FIG. 8 represents that many of these functions may be integrated on a single flash memory device, for example, a memory chip; alternatively, functions such as memory usage table 815 may be stored elsewhere in the system, for example, within memory dedicated to the controller 813, in an areas of reserved pages, in an extended page area, in a SPD module, on hard disk, in a software buffer, or via some other mechanism.

Computation of the per unit time limits used in the run-time mode is also explained with reference to FIG. 6. In particular, FIG. 6 indicates in block 617 that each time value may be stored in a buffer or register setting 605; if it is desired to compute per-unit time limits, then dashed line function block 619 is combined with the functions of function block 617 and no maximum-determination thread is employed. That is to say, each time value computed as the result of the predetermined "test" transaction is simply used as the time limit for the corresponding memory unit.

As mentioned above, memory calibration may be used in a number of ways.

First, as was introduced above in connection with FIG. 7, a single limit for a flash memory device may be computed and used during run-time to determine whether a memory transaction is taking too long; alternatively, measured times can be used by a controller in scheduling memory operations, with the controller effectively assuming that any transaction has completed within an associated limit, as explained above with reference to FIGS. 3 and 4. As just indicated above with reference to FIG. 8, multiple time limits may be computed, specific to each of several different memory subdivisions. In the application alluded to above, each of these embodiments may be applied to more consistently schedule memory transactions, obtain confidence that a memory transaction has been completed within an expected period, and mark a unit if a transaction does not complete within an expected, empirically determined limit. In some embodiments, a marked unit may be regarded as "bad" for the particular mode of operation, or it may simply be processed specially, for example, by having its associated time limit simply incremented. Other uses of calibrated memory are possible, however, and to this end, several embodiments will be presented in the figures and description that follow.

Figure 9:
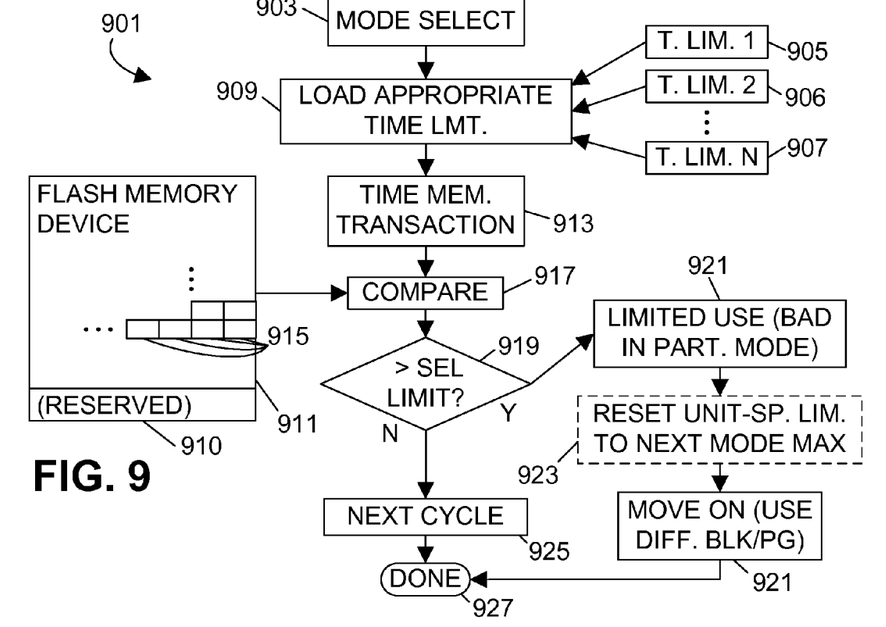
FIG. 9 shows a method that may be used by a master system, a memory subsystem or by application software, to select a memory mode based on desired system performance, with one or more limits employed for each memory mode, and to structure memory in dependence upon the selected mode. For example, if speedy memory performance is desired, a relatively small time limit may be selected, with memory units processed using a time limit that has been selected based on mode.
Figure 10:
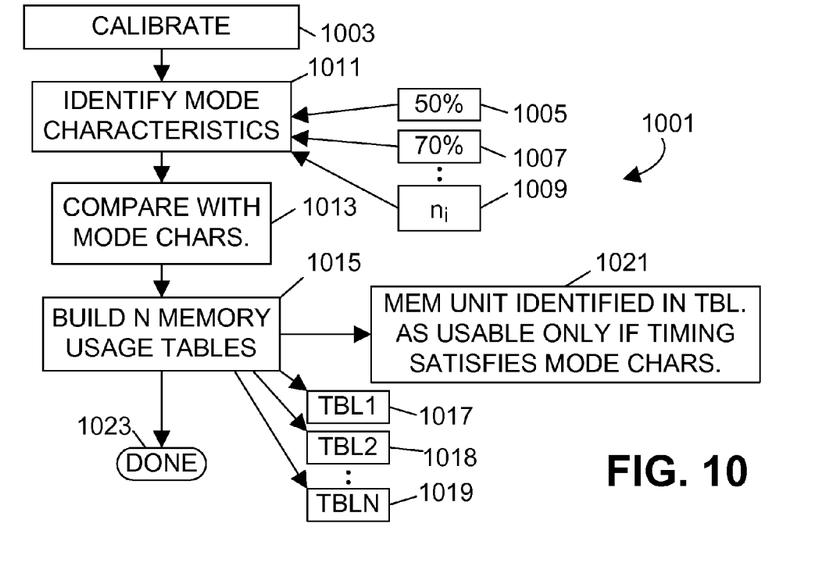
FIG. 10 shows a controller-implemented method of building usage tables based on selected mode. In particular, during power-up or a calibration interval, a controller may identify characteristics of each possible mode (1007, 1009 and 1011) and build corresponding memory usage tables (1017, 1018 and 1019) for use during run-time in connection with the corresponding mode.

In one embodiment, illustrated in FIGS. 9-10, multiple limits may be calculated, and an operating system or application may select between multiple memory modes, each having an associated limit. In this regard, while some embodiments mentioned above judge each memory unit as usable or "bad" based on an empirically determined limit, empirically-measured parameters may also be used to sort or prioritize memory units. In the embodiment of FIGS. 9-10, two or more limits may be computed, for example, based on statistical parameters. In one hypothetical implementation, one limit may be chosen to represent expected processing time associated with successful transaction processing by at least 70% of the memory units, and a second time limit may be chosen to select expected successful transaction processing by at least 90% of the units. A specific subset of memory units may then be defined as usable depending on the particular memory mode selected. For example, if performance is a factor that counsels low tolerance for long programming times, a memory table (such as table 211 of FIG. 2) may identify only those memory units that are the fastest 70% of overall memory (and identifying the other, slower memory units as reserved for limited use, i.e., "bad" with respect to the performance mode, but perhaps not bad in another mode). Alternatively, if the operating system or software employs a mode where performance is less important, it can apply a larger time limit in order to judge memory units as useable or "bad," with a memory table then identifying a larger number of blocks as useable.

Figure 11:
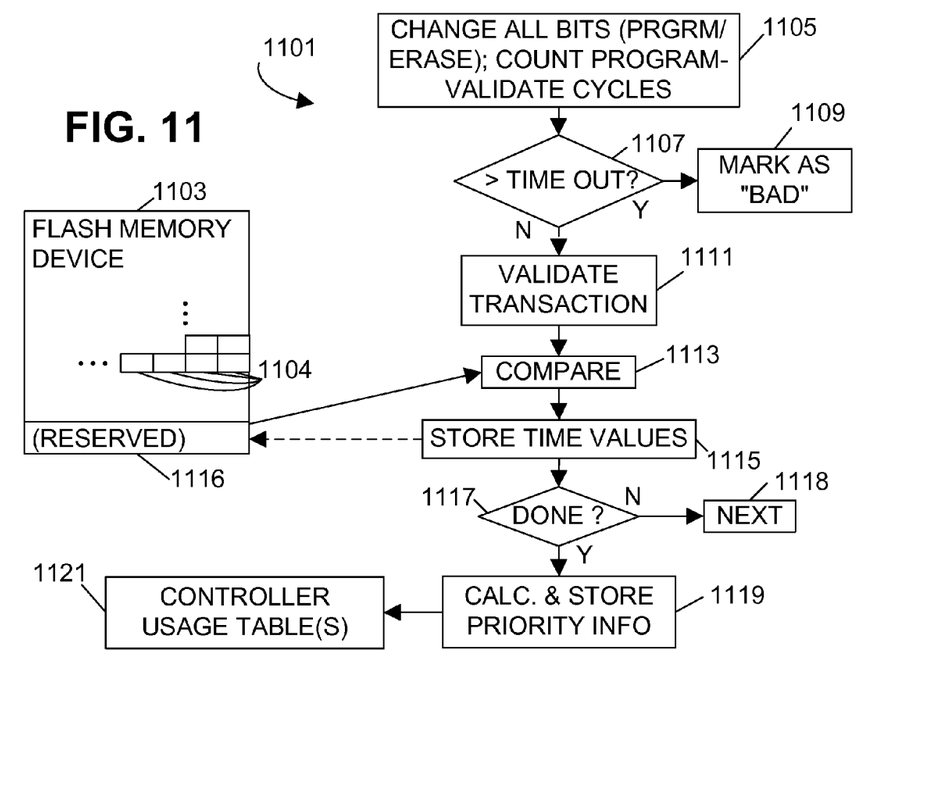
FIG. 11 relates to a system where memory units can be prioritized depending upon expected maximum transaction time.
Figure 12:
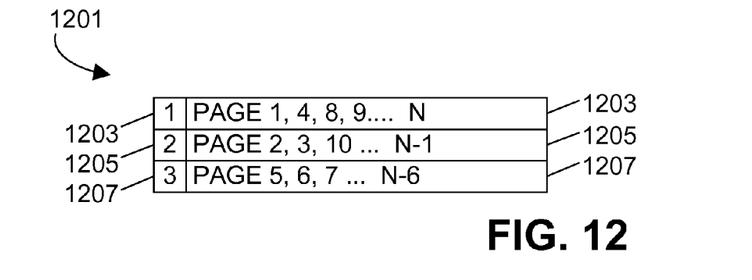
FIG. 12 shows an exemplary prioritization table.

In still another embodiment, represented by FIGS. 11-12, maximum transaction limits may be calculated for each memory unit and then used to prioritize selection of each memory unit. For example, if some memory units are measured to have especially good performance, these units may be used for memory that is expected to require more frequent transactions to improve overall system performance, while slower memory units may be used in less frequent transactions to minimize their impact upon performance, in a manner that also minimizes impact upon overall system capacity.

Figure 13:
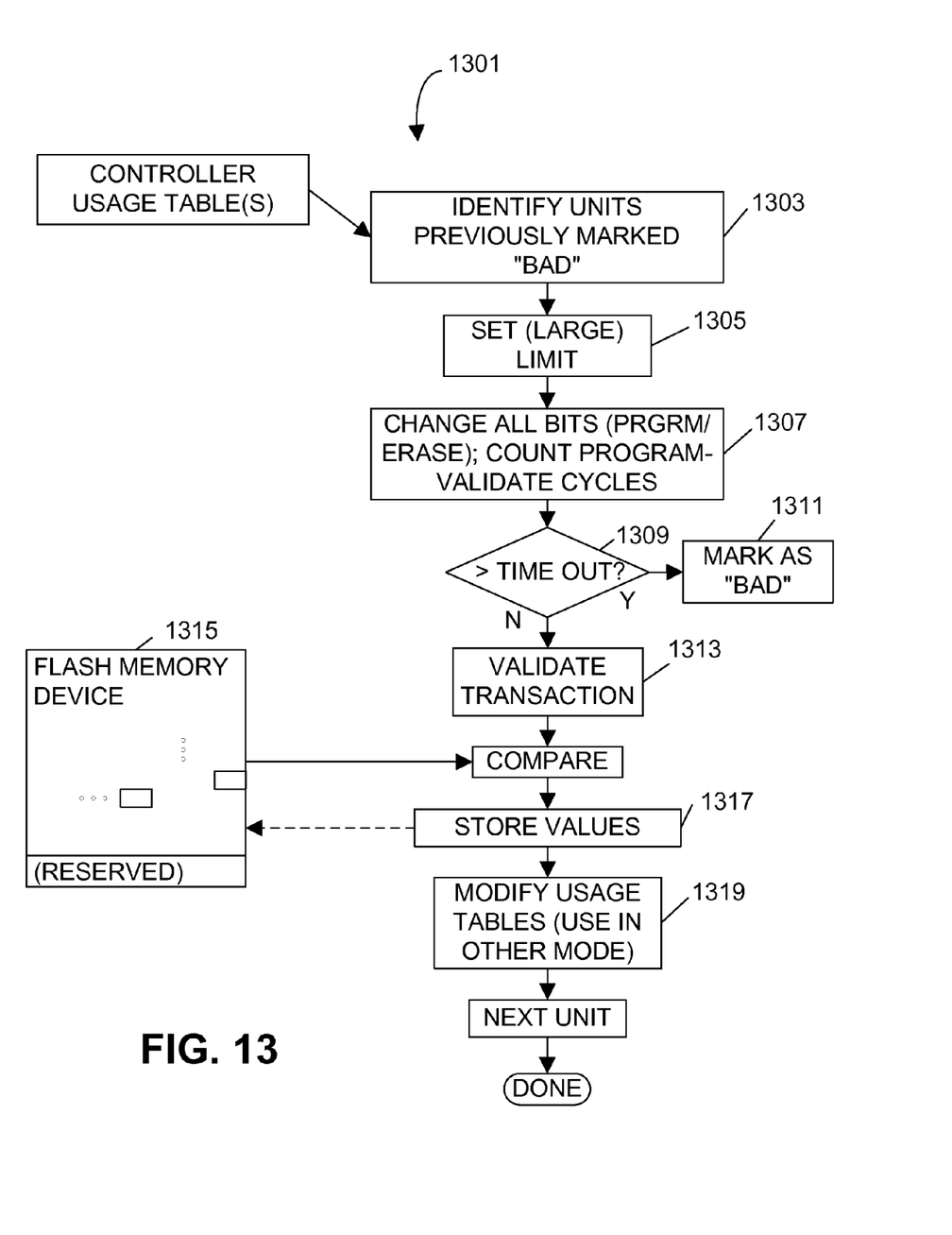
FIG. 13 illustrates a method by which memory units previously marked for limited use can be later reevaluated, for example, during power-up, at a calibration interval, or in connection with a special process for determining whether those units may be employed in another (non-performance) memory mode.

Finally, calibration of memory is something that may be repeated, and used to redefine pages or blocks ignored in one mode of operation as potentially acceptable in a different mode of operation. FIG. 13 is used to illustrate a method of recalibrated memory units previously marked as "bad."

With the principle parts thus presented, several additional uses of the methods and devices discussed above will now be introduced.

II. USE OF MULTIPLE FLASH MEMORY MODES

In practice, it is expected that only a small number of memory units will be marked as indicated above. Nevertheless, for purposes of flash memory scheduling, particularly for high turnover applications such as main memory, it is desired to have the greatest amount of consistency and predictability possible for purposes of memory transaction scheduling. To this end, even a relatively small amount of variability can create an impediment to the use of flash memory. While the embodiments discussed above provide for more efficient use and scheduling of memory transactions in flash memory embodiments, they do not completely in and of themselves eliminate variability in the use of flash memory.

One embodiment therefore makes use of the structures and methods described above to enable multiple memory modes. For example, using the pre-characterization methods discussed above, it is possible to organize memory according to transaction times. In one mode, performance can be emphasized, with very little tolerance for variation in memory transaction times. For example, using the calibration methods discussed above and measurement of per memory unit (e.g., per page or per block maximum transaction times), it is possible to identify the "fastest" memory units, and restrict processing to those units only, marking the remaining units as "bad" for that particular mode of operation. [As alluded to earlier, marking a unit as "bad" for one mode of operation is encompassed by the language marking the unit for "at most limited use," implying that the unit may be useable in other modes or for special purposes.] Conversely, if performance is not critical, e.g., flash memory is used as secondary storage only, it is possible to tolerate widespread variation in transaction times. The calibration methods mentioned herein facilitate use of different modes of using flash memory, thereby enhancing the potential market and application of flash memory. Any number of modes, or criteria for distinguishing modes may be selected by a skilled designer to suit the desired implementation.

FIG. 9 shows a block diagram of a run-time method 901 in a multiple mode system. In particular, a mode of operation is first selected by memory controller, the application, the operating system, or some other control mechanism, per reference numeral 903. In FIG. 9, "N" different modes are identified by reference numerals 905, 906 and 907. For simplicity of understanding, it should be assumed for the description below that exactly two different modes are employed, including a high performance mode (where a short time limit is defined to permit low variability in memory transaction times, and thus greater predictability in scheduling) and a high storage capacity mode, where variability is less important and it is desired simply to expediently mark blocks or pages as "bad" in a manner that minimizes controller overhead. Depending on the mode selected, an appropriate time limit is selected, as represented by function block 909. Similar to the manner described earlier, each time limit may be stored if desired in a protect portion or register 910 of a memory device 911, and a memory controller need only tell the flash memory device which mode to apply; alternatively a flash memory controller (not seen in FIG. 9) may compute and store time limits and program a register setting in each memory device 911 with the pertinent time limit. In the same manner as described earlier, a timer 913 or equivalent mechanism may be used to measure memory transaction time during each memory transaction, with transaction time being measured against the pertinent time limit, as indicated by function block 917. If the performance mode is chosen, the time limit will be smaller, and if the capacity mode is chosen, the time limit is selected to be more forgiving. Also, as was mentioned previously, time can be measured using any suitable unit, including number of program-validate cycles, clock cycles, or using some other measure, such as required control voltage. If a memory transaction times out, relative to the empirically determined "performance mode" time limit, the associated unit is marked as "bad" and the controller attempts a different block or page, as indicated by function blocks 919 and 921. If desired, a unit 915 marked as "bad" can be earmarked for possible use in a lower order mode, as indicated by dashed-line optional block 923; the system for example, can mark the particular memory unit as "bad" in a performance mode memory usage table, and similarly mark the particular memory unit as useable in the next lower order memory usage table (e.g., a memory usage table for a capacity mode, if two modes are used). If performance of the memory transaction is successfully validated, however, the system concludes the memory transaction, proceeding to a queued next memory transaction for example, as indicated by blocks 925 and 927.

As should be appreciated from the foregoing description, the use of multiple modes enables a programmer or system designer to consider tradeoffs in managing flash memory, and to adapt that memory dynamically. By empirically measuring and pre-characterizing performance of individual memory units, those units can be assigned to different modes of operation, thereby facilitating efficient scheduling and system management in a way not obtained by simply relying upon generic processor time-outs.

FIG. 10 illustrates a controller-implemented method 1001 for configuring flash memory for use in multiple modes. In particular, each memory unit associated with one or more flash devices (not show in FIG. 10) is calibrated and characterized as has been previously described, as indicated by reference block 1003. That is to say, each unit is subjected to a predetermined transaction that (i) determines whether the unit is "bad" because it violates a generic, conventional time-out, and (ii) further determines whether units which are not initially marked as "bad" are capable of faster operation. The method empirically measures maximum transaction time for each unit, as was described in connection with FIG. 6. Once these times are obtained, the method then identifies characteristics that uniquely characterize each mode, as indicated by function block 1011. For example, each mode is illustrated in FIG. 10 as having an associated set of criteria; a first mode 1005 is labeled "50%", indicating that the only the "fastest" half of memory units would be selected for this "performance mode." Similarly, a second mode 1007 is labeled 70% to indicate that the "fastest" 70% of units should be selected for this mode; similarly, an $N^{th}$ mode is labeled $n_i$, indicating that $n_i$ criteria are applied to characterize this mode. [Notably, these values are hypothetical only, used for purposes of explanation—it should be appreciated that in practice, memory units will not have normally-distributed programming times, such that a percentage based approach might be less than optimal; other approaches, including a wide variety of statistical approaches may be more appropriate for efficient flash memory application, and may be easily selected according to design objectives by one having ordinary skill in digital design.]

For each mode, the method 1001 then applies the mode characteristics to build a memory usage table, as indicated by reference numerals 1013-1023. The table will indicate those memory units that may be used in connection with the particular mode, and conversely, which memory units are marked as "bad" relative to the particular mode. Once tables are created for each memory mode, the system may be used in run-time operation, for example, per the method illustrated in FIG. 9.

III. USE OF CALIBRATION TO CREATE RELATIVE PRIORITIES WITHIN FLASH

In addition to using preconfigured modes of flash memory, methods and apparatuses discussed herein may also be employed to prioritize memory usage. As just indicated, in normal practice, it can be anticipated that most flash memory units will perform relatively quickly, and that slow or "bad" units will be in the extreme minority. As a consequence, instead of organizing memory according to a selectable mode, it is also possible to rank memory in terms of priority. For example, if a large number of memory units are all characterized by a specific, relatively low number of program-validate cycles needed for programming, then these units might be ranked as the "fastest" memory, with memory transactions skewed to these units. For example, "fast" units could be earmarked for memory transactions involving relatively frequent turnover, thereby minimizing overall time; these units could also be earmarked for storage of more important data. Organizing flash according to priority is similar to the methods described earlier, and is described with reference to FIGS. 11 and 12.

FIG. 11 depicts a method 1101 of a measuring maximum transaction time of a flash memory device 1103 using methods described earlier. In particular, subdivisions 1104 of memory may be calibrated using a predetermined memory transaction, as indicated by function block 1105. [If desired, this method may also be employed using individual flash memory devices as the memory unit; for example, combining this method with a multiple mode application, one flash memory device may be given priority over another, and multiple modes of flash usage can be implemented in a subset of flash devices, or only to flash memory having a specific level of priority.] As was the case for the methods described earlier, the predetermined memory transaction is ideally selected to be one that requires programming or erasing the maximum number of cells possible, such as a transaction that changes all bits associated with a memory unit from an erased state to a programmed state (or in the case of an erasing operation, from a programmed state to an erased state). The method may then compare program-validation with previously determined limits (for example, a unit specific time limit computed during a previous calibration) or a generic timeout, or both. If appropriate (i.e., if a unit cannot validate within the maximum time), an unresponsive memory unit is marked as "bad." These functions are indicated by reference numerals 1107, 1109, 1111 and 1113. If a validated transaction does not exceed the maximum time out period represented by block 1111, then a newly calibrated limit may be stored in a reserved portion of device memory, as indicated by reference numerals 1115 and 1116. The method 1101 then continues until all flash memory units under consideration are processed, as indicated by function blocks 1117 and 1118.

Once calibration of memory is complete, the system may then proceed to prioritize calibrated flash memory and build appropriate memory usage tables, as indicated by function blocks 1119 and 1121, respectively. Nearly any desired prioritization scheme may be implemented appropriate to the design environment. For example, the "fastest" several echelons of flash memory may each receive their own priority, or some other scheme may be utilized.

FIG. 12 depicts a hypothetical prioritization scheme 1201. In particular, each table may consist of a priority indicator and a table indicating the memory units having the matching priority. In FIG. 12, three levels of priority are indicated, 1203, 1205 and 1207, each having a matching table 1203, 1205 and 1207 that apportion "N" memory units between them. The priorities as depicted in FIG. 12 are seen to refer to only a small number of units, but it should be observed in practice that a value of "N" can be in the thousands or even millions, e.g., with potentially many thousands of pages in a memory device. As has been described earlier, memory may periodically be recalibrated, resulting in a reassignment of priority of memory units, with consequent change in units' priorities. During run-time, an operating system or application software may book memory according to priority, or may specify a minimum or maximum priority to be used for memory transactions.

IV. RE-CALIBRATION OF UNITS PREVIOUSLY MARKED

Particularly in systems that rely upon multiple modes of flash memory or where units of flash memory are prioritized, it is possible that a memory unit marked (e.g., as "bad" in one mode) may be capable of use in a different mode. FIG. 13 is used to explain how memory units previously marked may be recalibrated and potentially gainfully employed.

As indicated by FIG. 13, a method 1301 of recalibration accesses one or more controller usage tables to identify those blocks previously marked, as indicated by block 1303. Because a unit may be marked only due to slipping performance, it may be that the associated memory units are still capable of reliable operation within greater limits. Accordingly, the method 1301 delimits any applicable time limit to a maximum, generic time-out, as indicated by reference numeral 1305. The method then performs a predetermined transaction upon each identified memory space; the particular transaction employed is, again, a transaction that ideally measures the maximum time associated with any memory unit programming transaction or erasing transaction, as has been described earlier and as indicated by numeral 1307. If the transaction times-out, the system can again mark the particular unit as "bad" and then continue with the next unit to be recalibrated, per blocks 1309 and 1311; if the transaction does not timeout, the method can proceed to validate successful performance of the transaction using well known methods (i.e., as implied by block 1313, the method continues to the next program-validate cycle if success of the transaction cannot be verified). Once the transaction is successful, the method compares empirically measured time with any previous value stored in flash memory 1315; each unit being processed will have been marked in some earlier operation, and so, any such marking (and any previously-determined value) is supplanted by the new, empirically measured value, as indicated by function block 1317. The method proceeds in this manner, processing each unit for which recalibration is desired and modifying memory usage tables as appropriate, as indicated by reference numeral 1319. Once all memory units have been processed, recalibration can be deemed complete.

By providing a mechanism for effectively reconsidering memory units previously marked for limited use, the method 1301 provides a way of expanding the use of flash memory, and enables use of degenerated memory in lower order modes, or for other limited purposes. The method 1301 need not result in assignment of recalibrated units specifically to specific modes, e.g., it may be possible for example to reassign recalibrated units to special purpose applications such as use as reserved memory for example, or other uses. Also, units not subject to completed memory operations need not be marked as "bad," e.g., it is also possible to provide another form of special handling for these units, for example, by incrementing the associated time limit (e.g., by one, and if appropriate, calibrating memory again). As should be apparent, however, the described methods enhance the use of flash memory and provide flexibility that should expand its potential uses.

V. CONCLUSION

By providing a method of empirically measuring expected transaction times associated with flash memory, the methods and systems described herein potentially enhance the applications to which flash memory can be applied. For example, it was previously mentioned that flash memory exhibits attractive cost, form factor, power characteristics and thermal characteristics, but that inherent limitations of flash memory inhibit usage of flash memory to a number of applications. By facilitating more reliable scheduling of flash memory through the use of empirically measured data, and by presenting methods that allow recalibration of flash memory and use in multiple modes of memory operation and prioritization schemes, the embodiments discussed above potentially facilitate use of flash memory on a broader scale, potentially including main memory or other applications that represent non-conventional markets for flash memory.

Having thus described several exemplary implementations, it will be apparent that various alterations, modifications, and improvements will readily occur to those skilled in the art. Applications of the principles described herein to systems other than flash memory systems will readily occur to those skilled in the art. Also, as has been alluded-to above, a skilled designer may implement the methods and systems described above using any level of granularity, e.g., including device scale, block, page or other scale. Similarly, programming transactions are not the only transactions that can be calibrated, nor is one limited to calculating limits only for specific types of memory transactions; the methods described above may be applied to calculate times for transaction type (e.g., erasing transactions versus read transactions versus programming transactions versus other transactions) or, alternatively, one may base a time limit used for all purposes upon only one, relatively time-consuming transaction (e.g., a programming operation). Also, in a system where control voltage used to program cells is raised in a stepwise manner, one may similarly minimize allowed time by monitoring program voltage, instead of clock or program-validate cycles. There may be other potential applications of flash memory calibration other than just those explicitly presented above. Also, while the description above refers to the tables being stored in registers on the flash device itself, it should be understood that these tables and associated values may also be stored in the flash array, the flash controller, by an operating system, or in any other form of memory (such as DRAM or on hard disk). Such alterations, modifications, and improvements, though not expressly described above, are nonetheless intended and implied to be within the spirit and scope of this disclosure.

Accordingly, the foregoing discussion is intended to be illustrative only, to provide an example of one particular method and system for configuring a memory system; other designs, uses, alternatives, modifications and improvements will also occur to those having skill in the art which are nonetheless within the spirit and scope of the present disclosure, which is limited and defined only by the following claims and equivalents thereto.

The invention claimed is:

1. A method of utilizing a flash memory device, the flash memory device including a plurality of pages, the method comprising:
    characterizing a transaction time for at least one page, the characterizing including
        performing a memory operation on memory cells in the at least one page, the memory operation including performing a sequence of program-validate cycles until the memory cells are in one of a programmed state or an erased state;
        measuring a time delay associated with the sequence of program-validate cycles; and
        storing a limit based on the measured time delay, the limit corresponding to the transaction time for the at least one page, wherein the limit corresponds to a number of program-validate cycles in the sequence; and
    scheduling memory operations directed to the at least one page based on the limit, such that a memory operation does not precede expiration of the limit relative to an earlier memory operation directed to the at least one page.

2. The method of claim 1, wherein:
    the method further comprises periodically recharacterizing the transaction time for the at least one page to thereby re-determine the limit; and
    scheduling subsequent memory transactions involving the at least one page based on the re-determined limit.

3. The method of claim 2, wherein the periodically recharacterizing is performed during at least one of (i) device manufacture, (ii) digital system power-up, (iii) a predetermined calibration interval, (iv) performance of a programming transaction, and (v) performance of an erasing transaction.

4. The method of claim 1, wherein:
    the measuring measures the time delay based on the maximum number of the program-validate cycles for completion of the memory operation for any of the memory cells in a respective page.

5. The method of claim 4, further comprising:
    storing different limits for different ones of the plurality of pages; and
    when a subsequent memory transaction is to be performed upon a particular one of the plurality of pages, retrieving the associated limit and responsively marking the particular one of the plurality of pages if the subsequent transaction is not completed for the particular one of the plurality of pages within the associated limit.

6. A method according to claim 4, wherein:
    the at least one page is one of a first number of pages; and
    the method further comprises,
        characterizing a second transaction time for a second number of pages greater than the first number of pages, wherein at least one of the second number of pages is one of the first number of pages;
        storing a second limit, longer than the first-mentioned limit, based on the second transaction time;
        selecting one of the first-mentioned limit and the second limits based on whether an application requires performance over memory capacity; and
        when a subsequent transaction is to be performed on a particular page of one of the first number of pages and the second numbers of pages, responsively marking the particular page if the subsequent transaction is not completed within the selected limit.

7. The method of claim 1, wherein
    the method further comprises periodically recharacterizing the transaction time for the at least one page to thereby re-determine the limit.

8. The method of claim 7, wherein the periodically recharacterizing is performed by a computer operating system.

9. The method of claim 1, embodied as a method of operating a memory controller.

10. The method of claim 1, where characterizing and scheduling are performed during run-time for the flash memory device.

11. A method, comprising:
    associating a maximum time with each one of a plurality of units of subdivision of flash memory;
    for at least one of the units of subdivision
        attempting to perform a memory operation on memory cells in the at least one unit, the memory operation including performing a sequence of program-validate cycles until the memory cells are in one of a programmed state and an erased state,
        verifying correct performance of the memory operation,
        measuring a time period associated with correct performance of the memory operation, up to at least the maximum time associated with the at least one unit,
        if the time period is less than the maximum time, storing the time period as a new maximum time, and
        if the time period is greater than the maximum time, marking the at least one unit;
        wherein each of the time period, the maximum time and the new maximum time each correspond to an amount of time associated with an integer number of program-verify cycles associated with one of proper programming and proper erasing of a subsequent memory operation; and
    timing the application of memory commands directed to a particular unit of the at least one of the units such that a memory operation does not precede expiration of the time period relative to a preceding command directed to the particular unit.

12. The method of claim 11, further comprising:
    initiating a new memory transaction to be performed on the flash memory; and
    selecting one of the units upon which to perform the new transaction from the plurality of units based on whether the unit is marked.

13. The method of claim 11, wherein the attempting includes one of programming and erasing all of the memory cells in the at least one unit, the method thereby adapted to calibrate a time before which an ensuing memory transaction can be directed to any number of the memory cells in the at least one unit.

14. The method of claim 11, wherein marking the at least one unit includes at least one of marking the at least one unit as bad and marking the at least one unit for special processing.

15. The method of claim 11, wherein some of the units are marked for limited use, the method further comprising:
identifying each unit previously marked;
defining a new, larger, maximum time for each unit previously marked for limited use; and
performing the attempting, verifying and measuring for each unit previously marked for limited use using the corresponding new, larger, maximum time and
if the time period is less than the new, maximum time, defining the measured time period as a new maximum time for each unit where correct performance of the memory operation is verified for correct performance, and
if the time period is greater than the new, maximum time, marking the unit as bad.

16. The method of claim 11, wherein:
the associating includes retrieving a previously stored maximum time from a reserved memory area; and
the storing includes storing each time period in a location selected from the reserved memory area, a hard disk, an extended page of a flash memory device, a serial presence detect unit, non-volatile memory, an on-board register of the flash memory chip, and a memory system controller.

17. The method of claim 11, further comprising:
initiating a new memory transaction to be performed on said flash memory; and
selecting one of the units of flash memory upon which to perform the new transaction from the plurality of units in dependence upon maximum times associated with the units.

18. A flash memory device, comprising:
flash memory;
logic adapted to hold a value representing a programmably defined memory transaction time corresponding to a number of program-validate cycles for expected proper performance of a memory transaction in the flash memory; and
circuitry adapted to provide an output to a memory controller that indicates whether the memory transaction has completed within the memory transaction time.

19. A device according to claim 18, wherein the logic is adapted to interpret a memory command as specifying the number of program-validate cycles and to limit a memory transaction to the number of program-validate cycles specified by the command, the logic further operative to change the output based on whether the memory transaction completes successfully within the number of program-validate cycles.

20. A flash memory device, comprising:
flash memory;
logic adapted to hold a value representing a programmably defined memory transaction time corresponding to a number of program-validate cycles for expected proper performance of a memory transaction in the flash memory;
a register setting adapted to provide an output that indicates whether the memory transaction has completed within the memory transaction time; and
non-volatile storage to store a number of maximum memory transaction times, each time in association with at least one respective unit of memory subdivision and adapted for selective external retrieval and use.

21. The flash memory device of claim 20, wherein the memory operation includes a programming operation and wherein each respective unit of memory subdivision corresponds to a logical page of data.

22. An apparatus, comprising:
a register adapted to hold a register value;
flash memory;
a timer adapted to measure time involved in completing a memory transaction to a specified portion of the flash memory, the measured time comprising a timer value that corresponds to a number of program-validate cycles expected for proper completion of the memory transaction;
a comparator operatively coupled to the timer and the register to compare a timer value with the register value;
a table that for each portion of flash memory identifies at least those portions where the timer value has not exceeded the register value for a previous transaction; and
means for recalibrating time involved in completing a memory transaction for at least one portion of the flash memory previously indicated by the table to have a timer value that has exceeded the register value for the previous transaction.

23. The apparatus of claim 22, embodied as a memory system having a flash memory controller and at least one flash memory device.

24. The apparatus of claim 23, wherein each device includes a second table that identifies whether the timer value has exceeded the register value for a previous transaction for units corresponding to the device.

25. An apparatus, comprising
a register adapted to hold a register value;
flash memory;
a timer adapted to measure time involved in completing a memory transaction to a specified portion of the flash memory, the measured time comprising a timer value that corresponds to a number of program-validate cycles expected for proper completion of the memory transaction;
a comparator operatively coupled to the timer and the register to compare a timer value with the register value;
a table that for each portion of flash memory identifies at least those portions where the timer value has not exceeded the register value for a previous transaction; and
logic that redefines the register value if the timer value is less than the register value if a selected transaction is successfully completed.

26. An apparatus comprising instructions stored on a non-transitory machine readable medium, said instructions when executed adapted to cause a machine to:
retrieve a default limit associated with flash memory;
perform a predetermined transaction upon a portion of the flash memory, the predetermined transaction selected to be one of (i) an erasing transaction that erases all memory contents of the portion and (ii) programming transaction that programs all bits associated with the portion;
measure a time associated with successful completion of the predetermined transaction, wherein the time corresponds to a number of program-validate cycles expected for proper completion of an ensuing instance of the predetermined transaction;

store the time in association with the portion that was subject to the predetermined transaction, to thereby establish a new limit for future performance of a memory transaction on the portion; and time the application of at least one ensuing memory command directed to the portion of the flash memory so as to not precede expiration of the time relative to a preceding command directed to the portion.

27. The apparatus of claim 26, further comprising instructions that when executed are adapted to cause the machine to recalibrate portions of the flash memory previously marked as bad.

28. The apparatus of claim 26, said instructions further adapted to cause a machine to mark the portion of the flash memory for at most limited use if future performance of a memory transaction is not completed within the new limit.

29. The apparatus of claim 28, wherein each portion is a unit of memory subdivision that is one of a memory page and a memory erase block.

30. The apparatus of claim 26, said instructions further adapted to cause a machine to identify portions of memory previously marked for at most limited use and, with respect to at least such identified portions, to:
  attempt to perform the predetermined memory transaction upon each portion;
  set a new limit associated with successful completion of the predetermined transaction; and
  mark as bad each portion associated with unsuccessful completion of the predetermined transaction.

31. An apparatus comprising instructions stored on a non-transitory machine readable medium, said instructions when executed causing a machine to:
  select a desired memory usage mode from a set of choices including a high memory capacity mode, and a performance mode;
  interrogate a set of predetermined values associated with flash memory, each predetermined value representing a limit associated with a transaction for a specific subdivision of memory; and
  define a memory table adapted for use in managing memory transactions, with identification in the table as usable memory for each memory subdivision determined in dependence upon the predetermined value and the selected mode.

32. The apparatus of claim 31, wherein the instructions are adapted to cause a machine to, in response to selection of the performance mode, identify a specific memory subdivision in the table if its associated limit is less than a threshold.

33. The apparatus of 32, further comprising instructions stored on machine readable media, the instructions when executed causing a machine to prioritize memory subdivisions based on associated limit and to store the results of prioritization in the table.

34. A flash memory device, including:
  a register to store for each of a plurality of memory units of the flash memory device a value corresponding to a maximum program-validate cycles to be used for a program transaction in the respective memory unit; and
  a comparator to evaluate whether a program transaction directed to a respective one of the memory units has performed more cycles than specified by the register value for the respective one of the memory units;
  wherein the program transaction is halted if the program transaction exceeds the cycle count specified by the register value for the respective one of the memory units.

35. The flash memory device of claim 34, wherein:
  the flash memory device further comprises a timer to count in dependence on the number of program-validate cycles to be used for a predetermined program transaction; and
  the register is operatively coupled to the timer and is adapted to replace register contents with the timer contents if the predetermined program transaction successfully completes in less time than represented by prior register value.

36. The flash memory device according to claim 35, wherein the register includes multiple locations, each one corresponding to a page of memory of the device.

37. A method of utilizing a flash memory device, the flash memory device including a plurality of pages, the method comprising:
  characterizing a transaction time for at least one of the pages, the characterizing including
    performing a memory operation on memory cells in the at least one of the pages, the memory operation including performing a sequence of program-validate cycles until the memory cells are in one of a programmed state and an erased state;
    measuring a time delay associated with the sequence of program-validate cycles; and
    storing a limit based on the measured time delay, the limit corresponding to the transaction time for the at least one page; and
  scheduling memory operations directed to the at least one page, so as to not precede expiration of the limit relative to an earlier memory operation directed to the at least one page.

38. An apparatus adapted to issue commands to flash memory having flash memory pages, the apparatus comprising:
  a register adapted to store a value for each respective flash memory page, each value representing a time associated with proper programming of all memory cells in the respective flash memory page; and
  memory-controller-resident logic adapted to schedule the issuance of a memory command to a given flash memory page when the memory command follows a programming command to the given flash memory page in dependence on the value stored by the register for the given flash memory page.

39. The apparatus of claim 38, embodied as a flash memory controller.

40. The apparatus of claim 38, further comprising the flash memory and the flash memory pages.

* * * * *